(12) United States Patent  
Gupta et al.

(10) Patent No.: US 11,676,648 B2  
(45) Date of Patent: Jun. 13, 2023

(54) CURRENT STEERING IN READING MAGNETIC TUNNEL JUNCTION

(71) Applicant: Taiwan Semiconductor Manufacturing Co., Ltd., Hsinchu (TW)

(72) Inventors: Gaurav Gupta, Hsinchu (TW); Zhiqiang Wu, Hsinchu (TW); Yih Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/703,869

(22) Filed: Mar. 24, 2022

(65) Prior Publication Data

US 2022/0215869 A1 Jul. 7, 2022

Related U.S. Application Data

(63) Continuation of application No. 16/655,056, filed on Oct. 16, 2019, now Pat. No. 11,309,005.

(60) Provisional application No. 62/753,751, filed on Oct. 31, 2018.

(51) Int. Cl.  
*G11C 11/16* (2006.01)

(52) U.S. Cl.  
CPC ........ *G11C 11/1673* (2013.01); *G11C 11/161* (2013.01)

(58) Field of Classification Search  
CPC .............. G11C 11/1673; G11C 11/161; G11C 11/1693; G11C 11/165; G11C 7/06; H01L 43/08

USPC .......................................................... 365/158  
See application file for complete search history.

(56) References Cited

U.S. PATENT DOCUMENTS

| 6,590,804 | B1 | 7/2003 | Perner |
| 6,597,598 | B1* | 7/2003 | Tran ...................... G11C 16/28 365/100 |
| 6,646,911 | B2 | 11/2003 | Hidaka |
| 6,791,890 | B2 | 9/2004 | Ooishi |
| 7,236,391 | B2 | 6/2007 | Liaw |
| 8,116,123 | B2 | 2/2012 | Chen et al. |
| 9,171,589 | B2 | 10/2015 | Kim et al. |
| 9,852,783 | B1* | 12/2017 | Na ...................... G11C 11/1673 |
| 10,833,643 | B1 | 11/2020 | Broekaert |
| 2004/0240255 | A1 | 12/2004 | Smith et al. |

(Continued)

FOREIGN PATENT DOCUMENTS

| CN | 1414558 A | 4/2003 |
| CN | 1851822 A | 10/2006 |

(Continued)

*Primary Examiner* — Huan Hoang  
*Assistant Examiner* — Minh Dinh  
(74) *Attorney, Agent, or Firm* — Seed IP Law Group LLP

(57) ABSTRACT

The disclosed MTJ read circuits include a current steering element coupled to the read path. At a first node of the current steering element, a proportionally larger current is maintained to meet the requirements of a reliable voltage or current sensing. At a second node of the current steering element, a proportionally smaller current is maintained, which passes through the MTJ structure. The current at the first node is proportional to the current at the second node such that sensing the current at the first node infers the current at the second node, which is affected by the MTJ resistance value.

20 Claims, 10 Drawing Sheets

(56) References Cited

U.S. PATENT DOCUMENTS

| | | |
|---|---|---|
| 2012/0026799 A1 | 2/2012 | Lee |
| 2013/0164549 A1 | 6/2013 | Nishioka |
| 2016/0133321 A1 | 5/2016 | Nagey |
| 2017/0285117 A1* | 10/2017 | Drouin .................. G01R 33/09 |
| 2017/0345477 A1 | 11/2017 | Tomishima |
| 2020/0096543 A1* | 3/2020 | Romero ............... G01R 15/205 |

FOREIGN PATENT DOCUMENTS

| | | |
|---|---|---|
| CN | 102067230 A | 5/2011 |
| CN | 103165184 A | 6/2013 |
| CN | 106128497 A | 11/2016 |
| CN | 108564978 A | 9/2018 |
| JP | 2011-526046 A | 9/2011 |
| KR | 10-2013-0066501 A | 6/2013 |
| TW | 200302582 A | 8/2003 |

* cited by examiner

CURRENT STEERING IN READING MAGNETIC TUNNEL JUNCTION

BACKGROUND

Magnetoresistive random-access memory ("MRAM") is a promising non-volatile data storage technology. The core of a MRAM storage cell (or "bit") is a magnetic tunnel junction ("MTJ") in which a dielectric layer is sandwiched between a magnetic fixed layer ("reference layer") and a magnetic free layer ("free layer") whose magnetization polarity can be changed. Due to the tunnel magnetoresistance effect, the resistance value between the reference layer and the free layer changes with the magnetization polarity switch in the free layer. Parallel magnetizations ("P state") lead to a lower electric resistance, whereas antiparallel magnetizations ("AP state") lead to a higher electric resistance. The two states of the resistance values are considered as two logic states "1" or "0" that are stored in the MRAM cell.

In a spin transfer torque ("STT") MRAM ("STT-MRAM") cell, the write current is applied passing through the entire MTJ, i.e., reference layer, the dielectric layer, and the free layer, which sets the magnetization polarity of the free layer through the spin transfer torque effect. That is, the write current passes through a same path as the read path of the MRAM. In a spin-orbit torque ("SOT") MRAM ("SOT-MRAM") cell, a MTJ structure is positioned on a heavy metal layer with large spin-orbit interaction. The free layer is in direct contact with the heavy metal layer. Spin torque is induced by the in-plane current injected through the heavy metal layer under the spin-orbit coupling effect, which generally includes one or more of the Rashba effect or the spin Hall effect ("SHE effect").

Reading the MTJ resistance is the fundamental way to detect the state of the MTJ, i.e., either the P or the AP state, and hence to infer the information stored in the MRAM cell. However, while reading the MTJ, the read currents may induce switching of the magnetization of the free layer of the MTJ, thereby destroying the stored information, a phenomenon called "read disturb." The larger the read current, the more is the probability of overwriting the stored information ("read disturb rate"). Since read, write and retention properties of a MTJ are entangled, optimizing a MTJ to contain the read disturb issues normally sacrifices the write performance of the MTJ.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
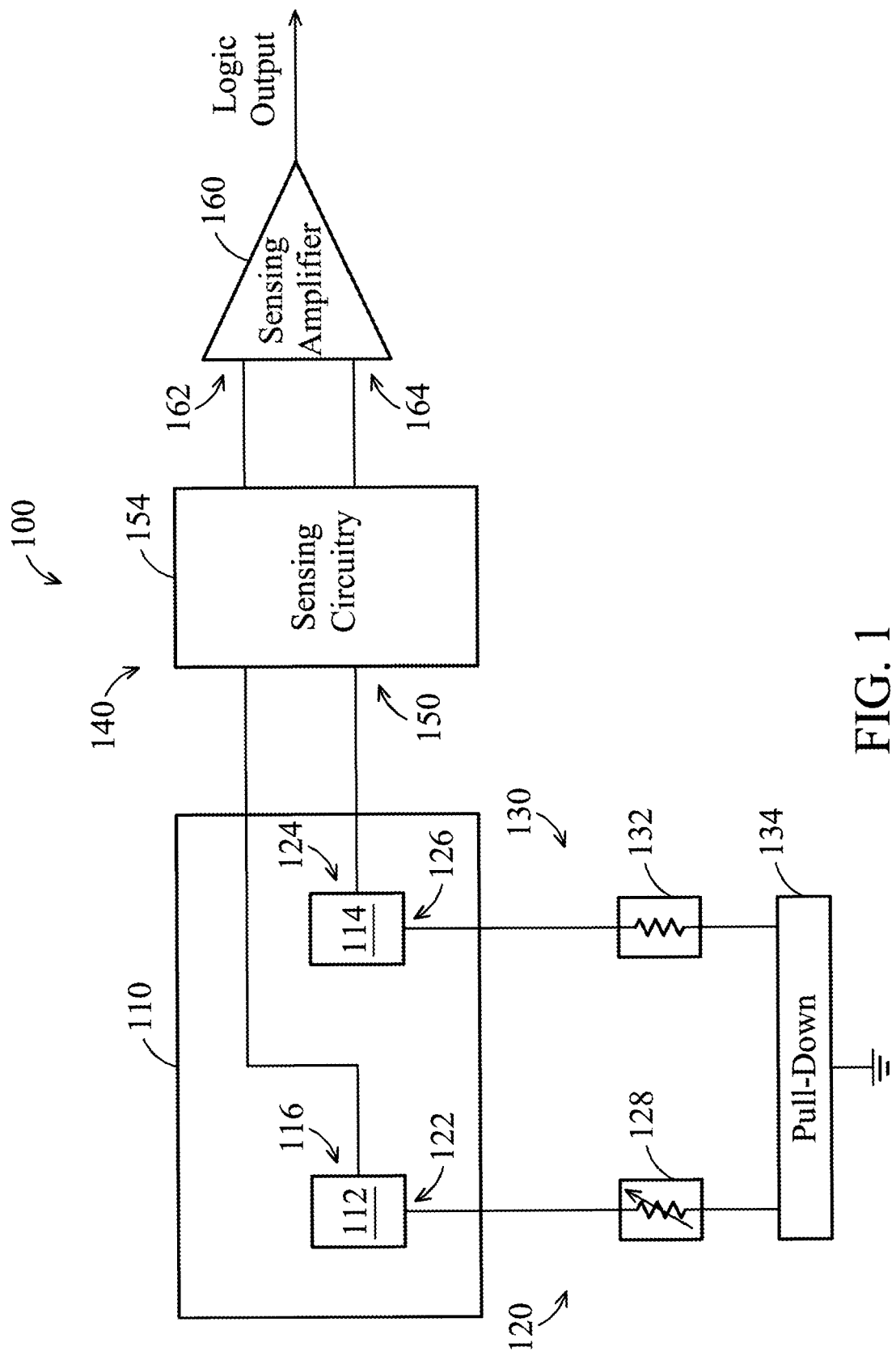
FIGS. 1-8 are example MTJ read circuits.

MTJ resistance depends on the relative magnetization orientation of the free layer with respect to the reference layer. A MTJ has the lowest resistance under the parallel state ("state") and the largest resistance under the antiparallel state ("AP state"). In reading the MTJ resistance, a current vertically passes through the entire MTJ, and one or more of the current value or a voltage drop across the MTJ is sensed to detect the state of the MTJ. To reliably detect the voltage drop, e.g., through a capacitor charging based approach or a capacitor discharging based approach, the read current cannot be arbitrarily reduced because a low current makes it difficult to sense the difference between the low current and a reference value. At the same while, a large read current may increase the read disturb rate.

The disclosed MTJ read circuits include a current steering element coupled to the read path. The current steering element splits a larger current into at least two smaller currents flowing through at least two separate current paths. At least one of the smaller currents is proportional to the larger current such that the smaller current and the larger current reflect one another in a mutual dependent manner. In an embodiment, at a first node of the current steering element, a proportionally larger current is maintained to meet the requirements of sensing the current. In current sensing, the sensed current is compared to a reference value to determine the relative value of the current with respect to the reference value. The actual value of the sensed current generally is not of concern. At a second node of the current steering element, a proportionally smaller current is maintained, which passes through a MTJ structure. The current at the second node of the current steering element is proportional to the current at the first node of the current steering element. In an embodiment, the current at the second node of the current steering element is a split share of the current at the first node and the rest of the split current is routed away from the MTJ read path, e.g., routed to the ground. The current at the second node is sufficiently small to avoid disturbing the magnetization orientation of the MTJ free layer. Because it is proportional to the current that passes through the MTJ, the current at the first node can be effectively sensed to determine/infer the magnetization state of the MTJ, i.e., either P or AP.

In an example embodiment, one or more of a PNP bipolar junction transistor ("BJT") in common collector mode or an n-type field effect transistor ("FET") in common source mode is used to implement the current steering element. For example, an emitter node of the PNP BJT in common collector mode is configured as the first node of the current steering element. The base node of the PNP BJT is configured as the second node of the current steering element. In both forward and reverse active biasing of the BJT, the emitter current is proportionally larger than the base current, with the base current=emitter current/($\beta$+1) and $\beta$>0. The proportionally smaller base current, $1/(\beta+1)$ relative to the emitter current, passes through the MTJ structure and the proportionally larger emitter current, ($\beta$+1) relative to the base current, is used for current/voltage sensing to infer the voltage drop by the MTJ. An n-MOS in common-source mode with diode-type configuration functions similarly as the BJT in common collector mode with respect to current steering. Other implementations of the current steering element are also possible and included in the disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 shows a block diagram of an example MTJ read circuit 100. The MTJ read circuit includes a current steering unit 110, a read path 120, a read reference path 130, a sensing path 140, a sensing reference path 150 and sensing amplifier 160. The current steering unit 110 includes at least two current steering elements 112, 114. The current steering element 112 is coupled to the read path 120 and the sensing path 140. The current steering element 114 is coupled to the read reference path 130 and the sensing reference path 150. Specifically, the current steering element 112 includes a first node 116 coupled to the sensing path 140 and a second node 122 coupled to the read path 120. A current at the second node 122 is proportional to and smaller than a current at the first node 116. The current steering element 114 includes a third node 124 coupled to the sensing reference path 150 and a fourth node 126 coupled to the read reference path 130. A current at the fourth node 126 is proportional to and smaller than a current at the third node 124. In an embodiment, the current steering element 112 and the current steering element 114 substantially mirror one another in the structures and parameters thereof. For example, a current gain, e.g., a ratio, of the node 116 current over the node 122 current of the current steering element 112 is substantially the same as a current gain, e.g., a ratio, between the node 124 current and the node 126 current of the current steering element 114.

The read path 120 includes a MTJ structure 128, which exhibits two different resistance magnitudes for two different magnetization states, AP or P states, indicating the magnetization orientation of the free layer of the MTJ structure 128. Note that the MTJ structure 128 includes a reference layer, a free layer and a tunnel barrier layer sandwiched between the reference layer and the free layer. The read reference path includes a reference resistor 132. The reference resistor 132 may be any resistive element with a known resistance value or known resistance value scope/range. In some embodiment, the reference resistor 132 is a same MTJ structure as the MTJ structure 128 and the reference MTJ 132 is set to one of the AP or the P state to provide reference. Other than the MTJ structure 128 or the reference resistor 132, the read path 120 and the read reference path 130 are configured to substantially mirror one another. That is, the read path 120 and the read reference path 130 include same circuitry units of substantially same parameters, except for the MTJ 128 or the reference resistor 132. For example, the MTJ 128 of the read path 120 and the reference resistor 132 of the read reference path 130 are each coupled to a respective pull-down resistor 134 of substantially same resistance values.

Similarly, the sensing path 140 and the sensing reference path 150 mirror one another in the sensing circuitry 154 thereof. That is, the sensing reference path 150 includes substantially same sensing circuitry 154 components of substantially same parameters as those of the sensing path 140. In a current sensing approach of detecting voltage drop by the MTJ structure 122, the sensing path 140 and the sensing reference path 150 each includes a current mirror circuitry that mirror the node 122 current and the node 126 current to flow into respective into respective resistance divider circuitry. The respective voltage outputs of the resistance divider circuitries are fed into differential input nodes 162, 164 of the sensing amplifier 160.

The sensing amplifier 160 may be one of a current comparator or a voltage comparator, or other circuitry elements capable of detecting a difference between inputs at the differential input nodes 162, 164, and output a logic/digital output indicating a relative value between the inputs at the differential input nodes 162, 164.

In operation, a read enable signal/clock ("RE") (not shown for simplicity) switches on the read path 120, the read reference path 130, the sensing path 140 and the sensing reference path 150. The node 122 current is affected by the resistance value of the MTJ structure 128. The node 126 current is affected by the reference resistor 132. Given that the read reference path 130 mirrors the read path 120, except for the MTJ structure 128 and the reference resistor 132, a difference or similarity between the node 122 current and the node 126 current reflects a difference or similarity between the MTJ 128 resistance and the reference resistor 132 resistance. As the current steering elements 112 and 114 mirror one another, the difference or similarity between the node 122 current and the node 126 current can be shown proportionally as a difference between the node 116 current and the node 124 current.

Through the functions of the current steering elements 112, 114, the node 116 current and the node 124 current are proportional to and larger than the node 122 current and node 126 current, respectively.

The sensing circuity of the sensing path 140 and the sensing reference path 150 sense the difference between the node 124 current and the node 126 current, either directly or indirectly through current mirror circuitries. In an embodiment, current mirror circuitries of the sensing path 140 and the sensing reference path 150 mirror the node 116 current and the node 124 current, respectively, into mirror currents which are sensed, through current sensing, as voltage inputs to differential input nodes 162, 164 of the sensing amplifier 160. The mirrored currents reflects the node 122 current or the node 126 current with an enlarging factor that is higher than 1. The input at the differential input node 162 ultimately reflects the MTJ read path 120 current at the second node 122. The input at the differential input node 164 ultimately reflects the read reference current at the fourth node 126. The comparison between the node 162 input and the node 164 input reflects the comparison between the node 122 current and the node 126 current. The difference or similarity between the node 162 input and the node 164 input infers to the resistance value of the MTJ 128 as compared to the resistance value of the reference resistor 132. With the resistance value of the reference resistor 132 known or determined, the resistance value or resistance state of the MTJ structure 128 or the logic information stored at the MTJ structure 128 is thus determined or "read".

Figure 2:
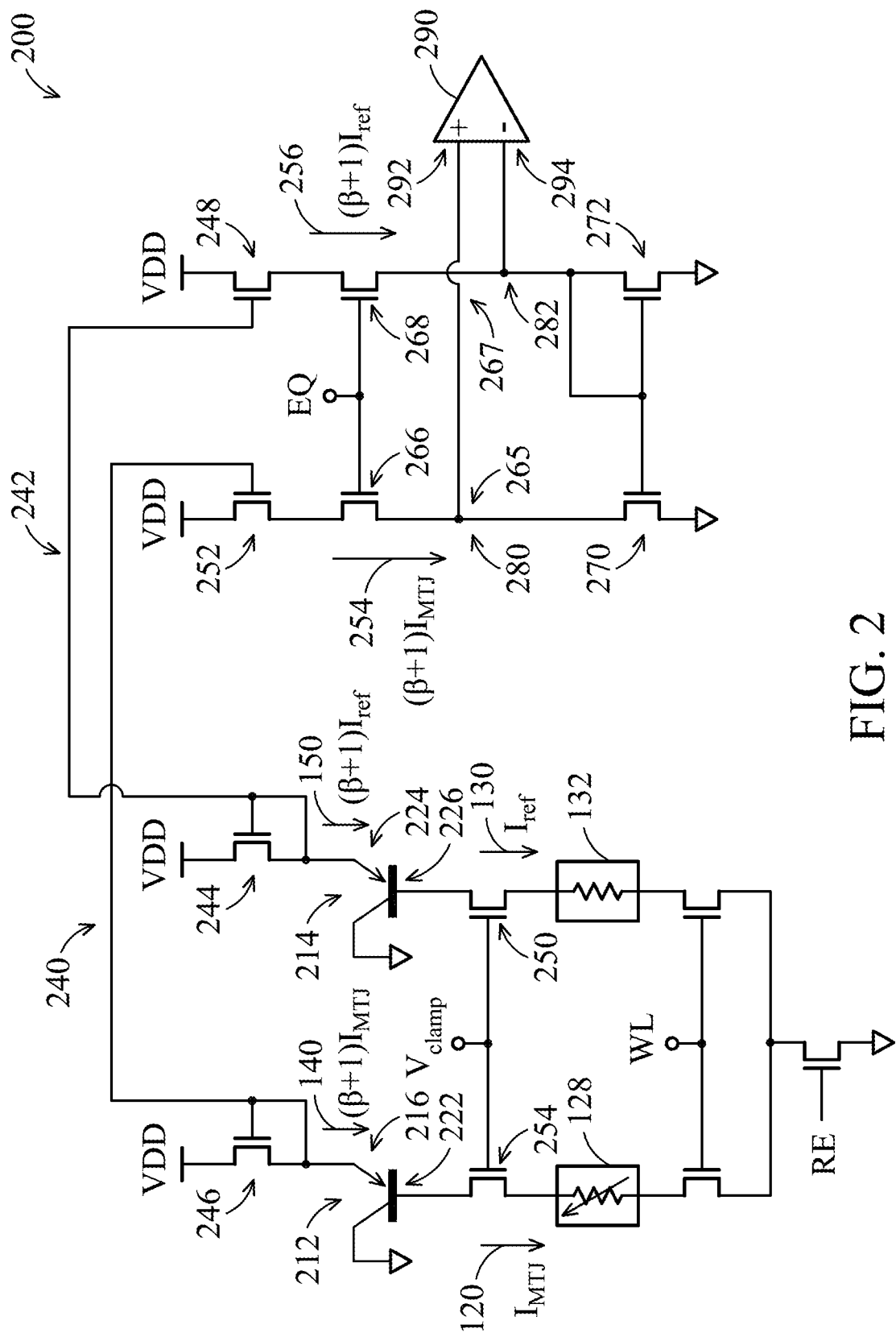

FIG. 2 shows an example circuit implementation 200 of the circuit block 100. In the circuit 200, the current steering elements 112, 114 are implemented through PNP BJT devices 212, 214 configured in common collector mode. A current IMTJ 220 flows through the read path 120, and a current $I_{REF}$ 230 flows through the reference path 130. Specifically, the base node 222 of the BJT 212 is coupled to the MTJ 128 in the read path 120. The base node 226 of the BJT 214 is coupled to reference resistor 132 in the read reference path 130. The emitter 216 of the BJT 212 is coupled to a current mirror element 240 that includes two transistors 246, 252, e.g., MOSFET transistors configured to operate in the saturation or the active modes. The emitter 224 of the BJT 214 is coupled to a current mirror element 242 includes two transistors 244, 248, e.g., MOSFET transistors configured to operate in the saturation or the active modes.

In an embodiment, the BJT devices 212, 214 match one another, i.e., they have substantially same parameters, e.g., a substantially same current gain β. As such, the emitter node 216 current equals to (β+1) times the base node 222 current. The emitter node 224 current equals (β+1) times the base node 226 current. In an embodiment, the transistors in a same current mirror element, 246, 252 or 244, 248, match with one another in parameters. As such, the emitter 216 current is mirrored to mirror current 254 in a substantially 1:1 ratio, i.e., (β+1) times the MTJ read path 120 current. Similarly, the emitter 224 current is mirrored to mirror current 256 in a substantially 1:1 ratio, i.e., (β+1) times the read reference path 130 current.

In an embodiment, the reference resistor 132 is set to have a resistance value substantially equal to an AP state resistance value of the MTJ structure 128, i.e., the highest resistance value of the MTJ structure 128.

When the MTJ 128 is in the AP state, the MTJ 128 resistance is substantially equal to the reference resistor 132 resistance, the base nodes 222 current and the base node 226 current are substantially equal to one another. The emitter node 216 current is (β+1) times the base node 222 current. The emitter node 224 current is (β+1) times the base node 226 current. The emitter node 224 current is substantially equal to the emitter node 216 current, which are separately mirrored to the mirror currents 256, 254, respectively, with the transistor 266, 268 being switched on by an equalization signal EQ. The mirror currents 256 passes through a resistive divider circuitry 265 formed by the transistors 266 and 270. The mirror currents 254 passes through a resistive divider circuitry 267 formed by the transistors 268 and 272. Transistors 266 and 268 mirror one another. Transistors 270, 272 mirror one another. With the mirror currents 256, 254 equal to one another, and separately passing through the matching resistance dividers 265, 267, respectively, the read voltage 280 and the reference voltage 282, as outputs of the resistance divider circuitries 265, 267, respectively, are substantially equal to one another.

The read voltage 280 and the reference voltage 282 are fed into a voltage-based sensing amplifier 290 as differential inputs to inputs nodes 292, 294. With the read voltage 280 substantially equal to the reference voltage 282, the voltage-based sensing amplifier 290 generates an output of zero voltage, which signals a MTJ reading of "AP" or a logic state of "0".

Figure 2A:
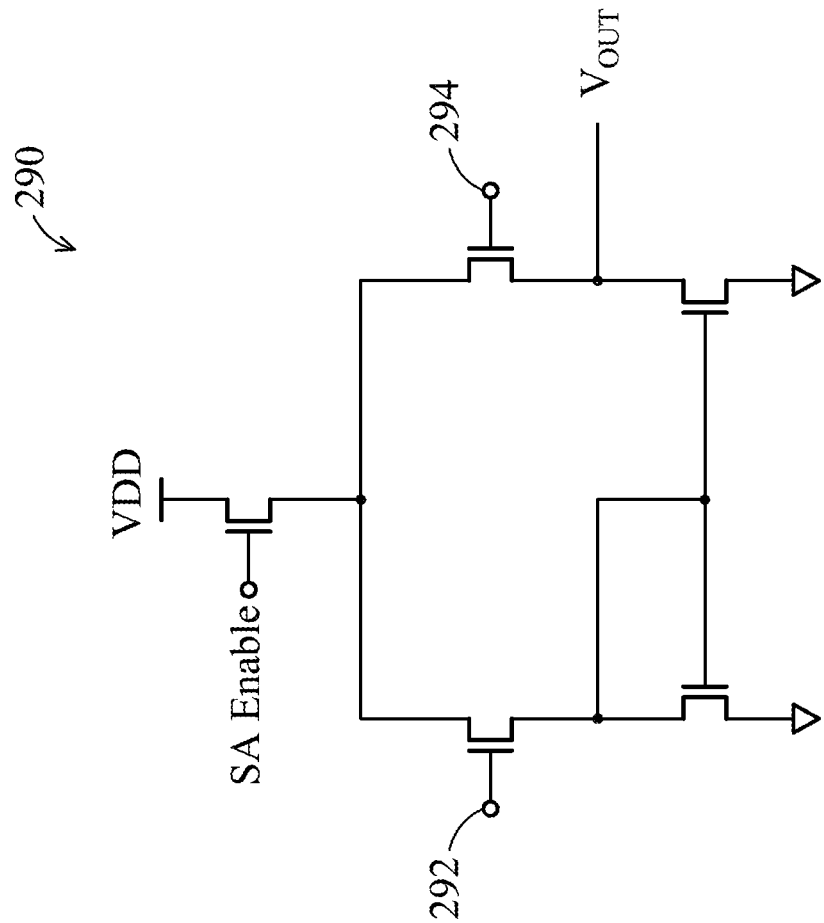

FIG. 2A shows an example voltage-based sensing, which may be used to implement the sensing amplifier 290. The disclosure, however, includes any sensing amplifiers and is not limited by any sensing amplifier structure.

In the disclosure, the reference numbers 120, 130, 140, 150 are each used to refer both the respective path and the current in the path for descriptive purposes.

If the MTJ structure 128 is in the P state, the MTJ structure 128 resistance is smaller than that of the reference resistor 132. The base node 222 current 120 that passes through the MTJ structure 128 is larger than the base node 226 current that passes through the reference resistor 132 of larger resistance. So eventually, the mirror current 254 is larger than the mirror current 256. As such, the read voltage 280 is larger than the reference voltage 282. The voltage-based sensing amplifier 290 (FIG. 2) generates an output of VDD, which signals a MTJ reading of "P" or a logic state of "1".

Optionally, the read circuit 200 also includes a clamping switch 254, 250 in the read path 120 and the read reference path 130, respectively. The clamping switch 254, 250 are controlled by a clamping voltage $V_{clamp}$, which prevents an electrical potential applied on the MTJ structure 128 from falling too low to enable a breaking through of the tunnel barrier layer of the MTJ structure 128. The voltage value of the $V_{clamp}$ is determined or selected based on the device/circuitry design, which is all included in the disclosure. In an embodiment, the $V_{clamp}$ is in a range of about 0.2 to about 0.5V. In an embodiment, the $V_{clamp}$ is provided by a same voltage source as the read enable signal RE, which provides timing control of the MTJ read operation.

Figure 3:
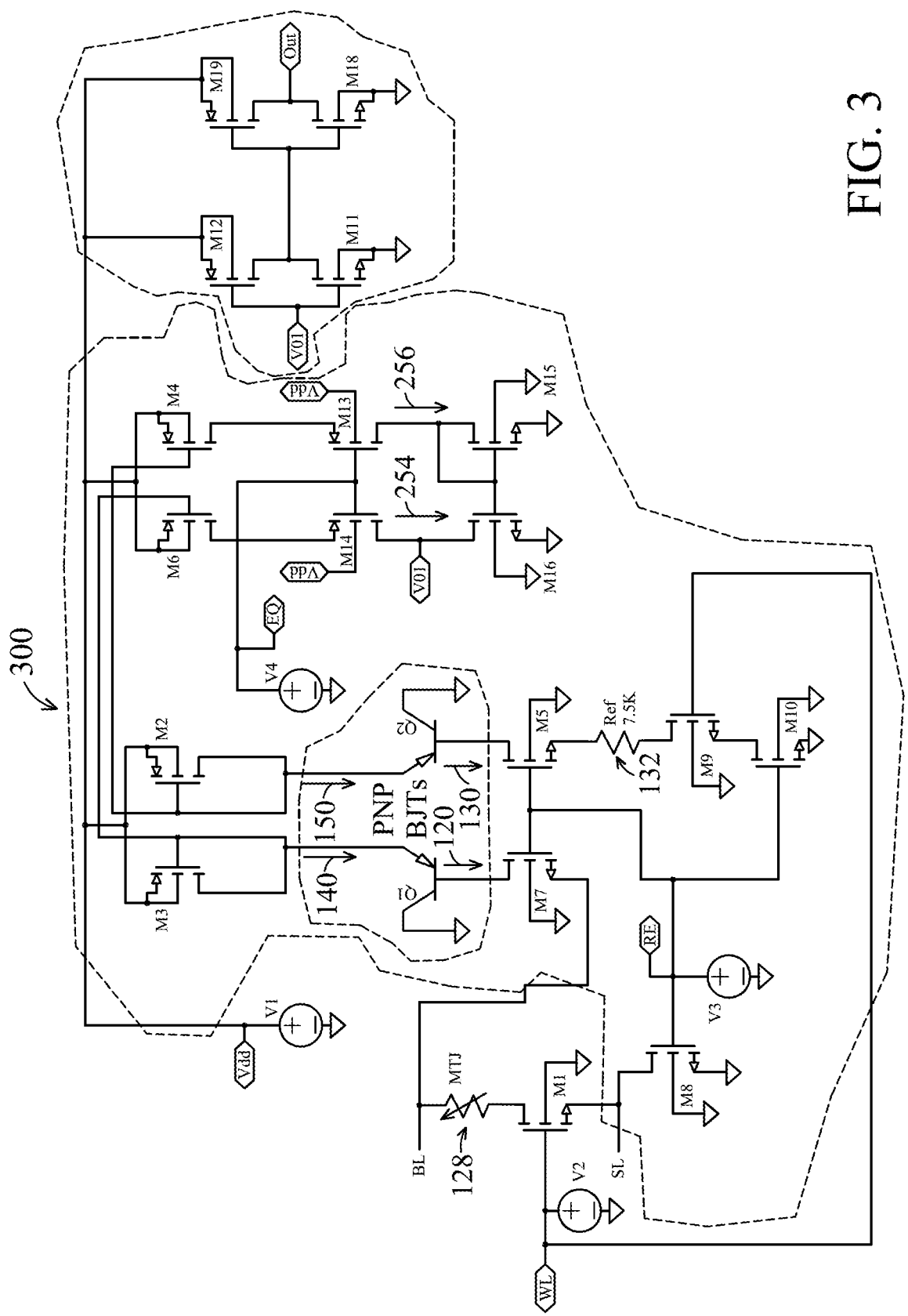

FIG. 3 shows example details of the circuit components and parameters in implementing the circuit 200 of FIG. 2. It should be appreciated that the detail embodiments of FIG. 3 are for illustrative purposes and for a thorough appreciation of the disclosed techniques. The specific parameters of the circuit 300 are not meant to be limiting.

Figure 4:
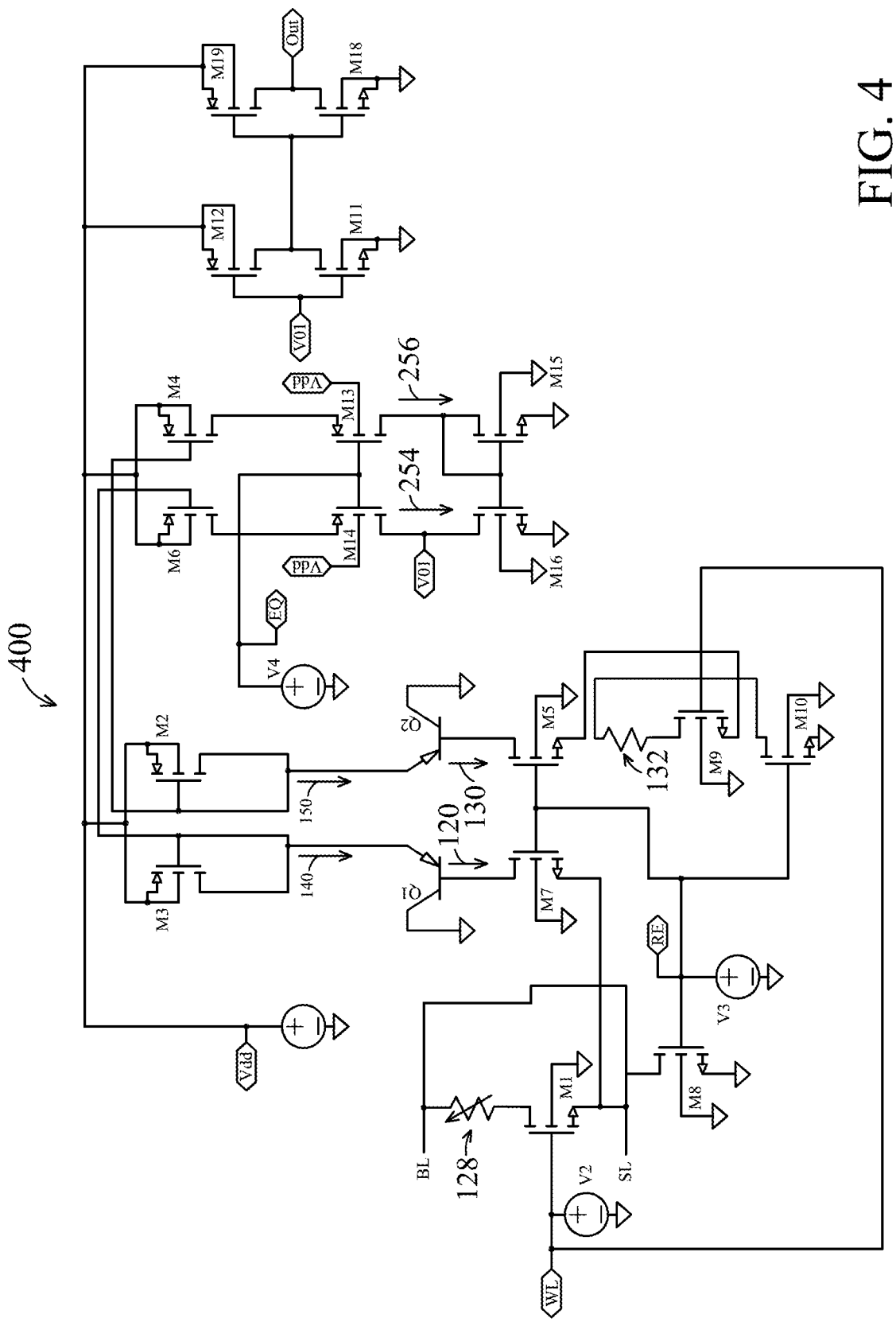

The example circuit of FIGS. 2 and 3 represent a forward read approach, e.g., the read current flows from the reference layer to the free layer of the MTJ structure 128. Other MTJ read approaches are also possible and included in the disclosure. For example, similar current steering unit/elements are also applicable to a read circuit of a backward read approach, where the read current flows through the MTJ structure 128 from the free layer to the reference layer of the MTJ structure 128. FIG. 4 shows example details of a backward MTJ read circuit 400, which is similar to the circuit 300 of FIG. 3, except that the 200 of FIG. 2 flows to the current steering unit.

In the read circuits 200, 300, 400 of FIGS. 2, 3, 4, a BJT in common collector mode is used to implement the current steering element. This embodiment does not limit the scope of the disclosure. Other current steering approaches are also possible and included in the disclosure.

Figure 5:
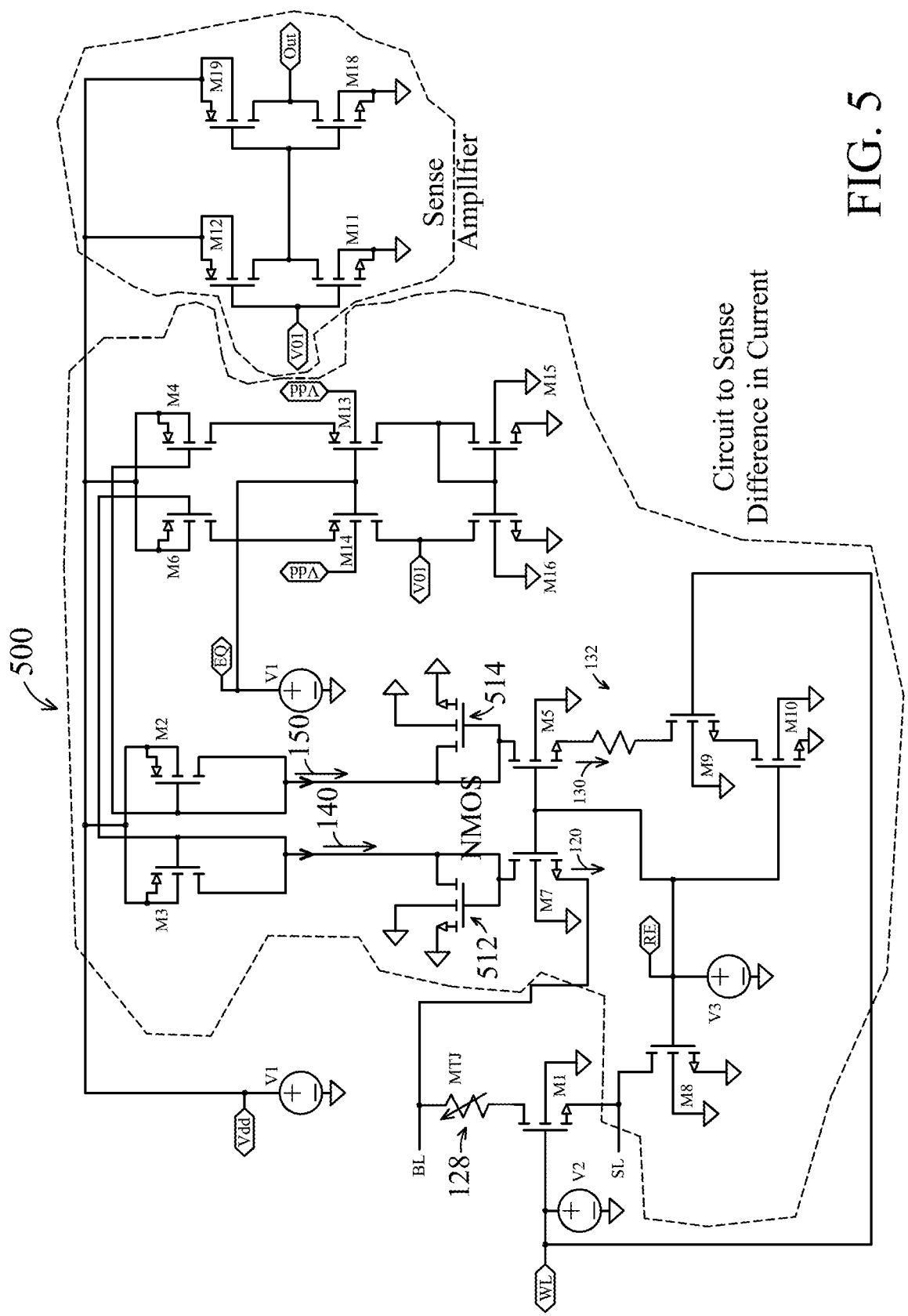

FIG. 5 shows an example MTJ read circuit 500. As shown in FIG. 5, the MTJ read circuit 500 is very similar to the MTJ read circuit 300 of FIG. 3, except that the BJT elements 212, 214 are replaced by nMOS elements 512, 514 configured in common-source mode. The gate node of the nMOS 512 is coupled to the MTJ read path 120, while the drain node of the nMOS 512 is coupled to the sensing path 140. The gate node of the nMOS 514 is coupled to the read reference path 130, while the drain node of the nMOS 514 is coupled to the sensing reference path 150.

The common-source mode nMOS 512, 514 are generally considered as voltage amplifiers having voltage gain between the gate node input and the drain node output. The drain node current is not directly controlled by the gate node current. However, with all components of the read path 120 and the read reference path 130 known and mirrored, the proportional ratios between the gate node current and the drain node current of each of the nMOS 512, 514 are fixed. As such, the operation of the MTJ read circuit 500 is very similar to that of the MTJ read circuit 300, the description of which is omitted for simplicity purposes.

Figure 6:
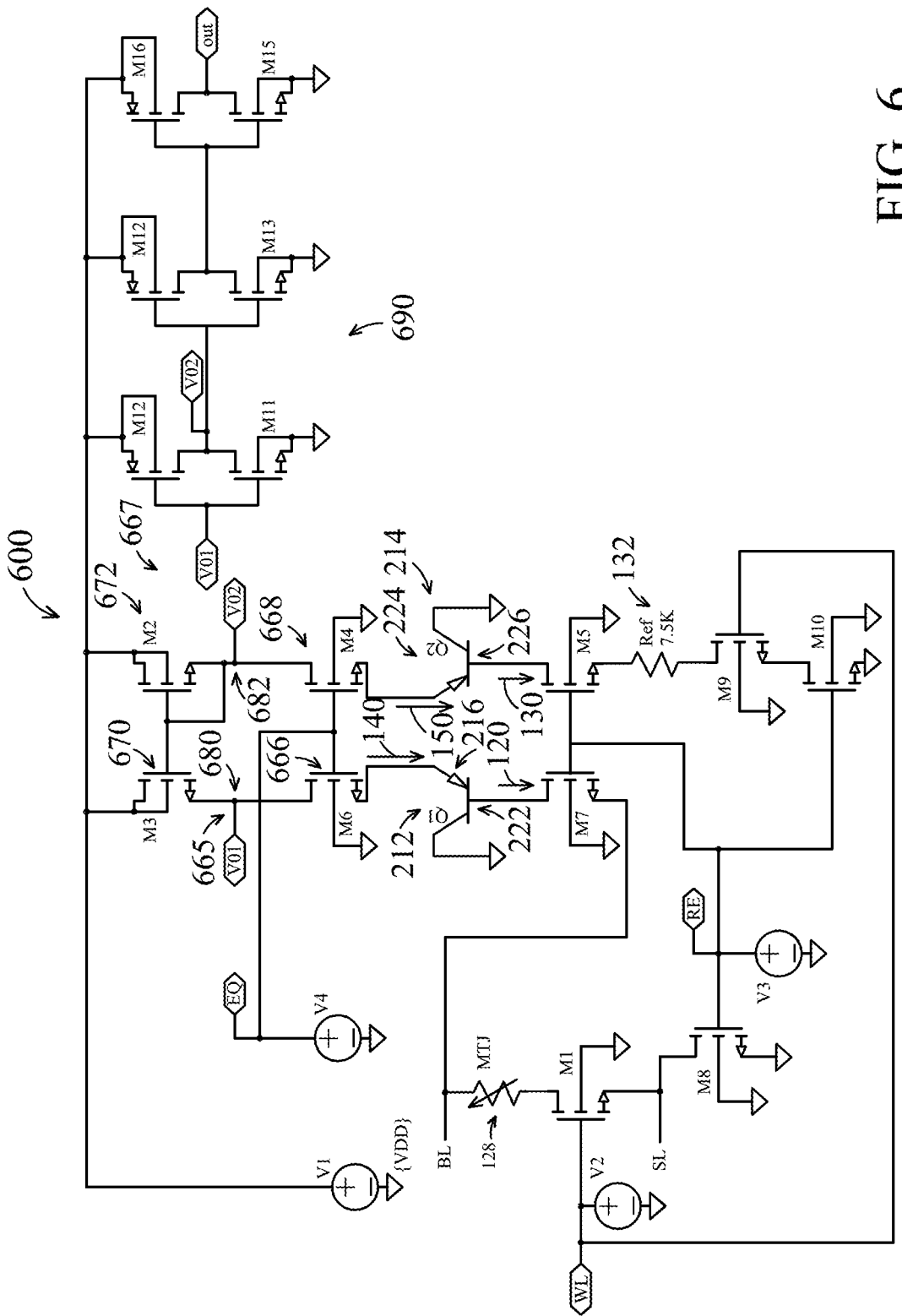

The MTJ read circuits 200, 300, 400, 500 shown in FIGS. 2, 3, 4, 5 all include current mirror elements in the sensing path 140 or the sensing reference path 150, which does not limit the scope of the disclosure. In other embodiments, the larger current of the current steering elements are directly sensed through voltage sensing or current sensing. For example, FIG. 6 shows another MTJ read circuit 600 that senses the sensing path 140 current and the sensing reference path 150 current directly using current sensing circuities. Specifically, a resistance divider circuitry 665 is coupled between a voltage source VDD and the emitter node 216 of the current steering element 212. A resistance divider circuitry 667 is coupled between the voltage source VDD and the emitter node 224 of the current steering element 214. The resistance divider circuitry 665 is formed through resisters 666 and 670 in series coupling. The resistance divider circuitry 667 is formed through resisters 668 and 672 in series coupling. Transistors 666 and 668 mirror one another. Transistors 670 and 672 mirror one another. The emitter node 216 current equals to ($\beta$+1) times the MJT read path 120 current at the base node 222. The emitter node 224 current equals to ($\beta$+1) times the read reference path 130 current at the base node 226. In the case that the MTJ 128 resistance is equal to that of the reference resistor 132, which is, e.g., set as equaling to the AP state resistance of the MTJ 128, the emitter node 216 current is equal to the emitter node 224 current. As such, the voltage drop across the resistance elements 670, 672 are the same. The MTJ read voltage identified at the node 680, as an output of the resistance divider circuitry 665 is equal to the reference voltage identified at the node 682, as an output of the resistance divider circuitry 667. Comparing the MTJ read voltage 680 and the reference voltage 682 at the sensing amplifier 690 yields a first logic output, e.g., "0". In the case that the MTJ 128 resistance is smaller, e.g., P state resistance, to that of the reference resistor 132, e.g., set as equaling to the AP state resistance of the MTJ 128. The emitter node 216 current is larger than the emitter node 224 current. As such, the voltage drop across the resistive elements 670 is larger than the voltage drop across the resistive element 672. As such, the MTJ read voltage 680 is smaller than the reference voltage 682. Comparing the MTJ read voltage 680 and the reference voltage 682 at the sensing amplifier 690 yields a second logic output, e.g., "".

Figure 7:
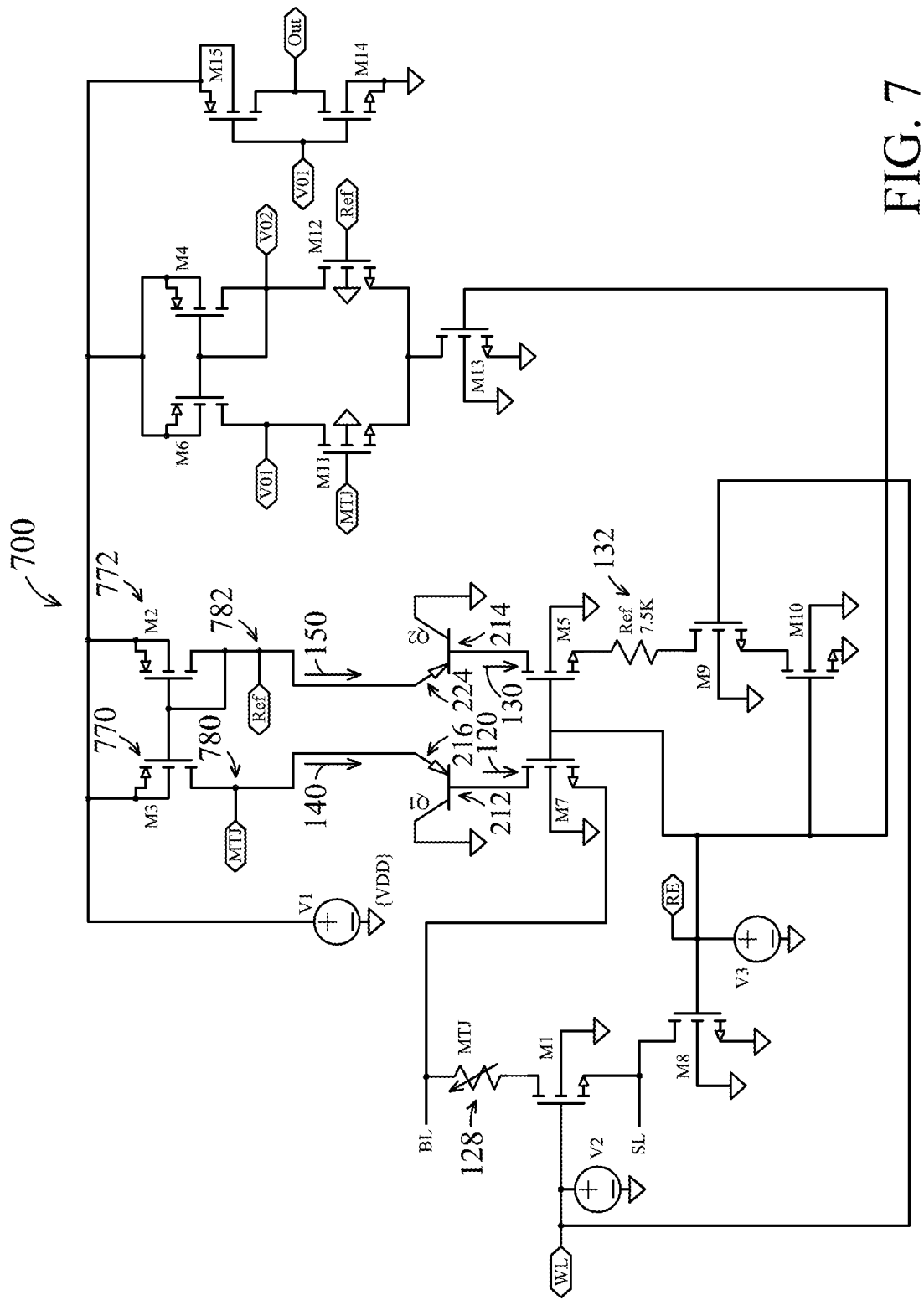

FIG. 7 shows a MTJ read circuit 700 that senses the sensing path 140 current and the sensing reference path 150 current directly using voltage sensing circuities. Specifically, a resistance element 770 is coupled between a voltage source VDD and the emitter node 216 of the current steering element 212. A resistance element 772 is coupled between the voltage source VDD and the emitter node 224 of the current steering element 214. Resistive elements 770, 772 mirror one another. The MTJ read voltages 780 and the reference voltage 782 are obtained directly as voltages at the emitter node 216 or 224, respectively, which reflects voltage drop through the resistive elements 770, 772. Other than the identified differences, the operation of the read circuit 700 is similar to that of the read circuit 600 of FIG. 6, the description of which is omitted for simplicity purposes.

Figure 8:
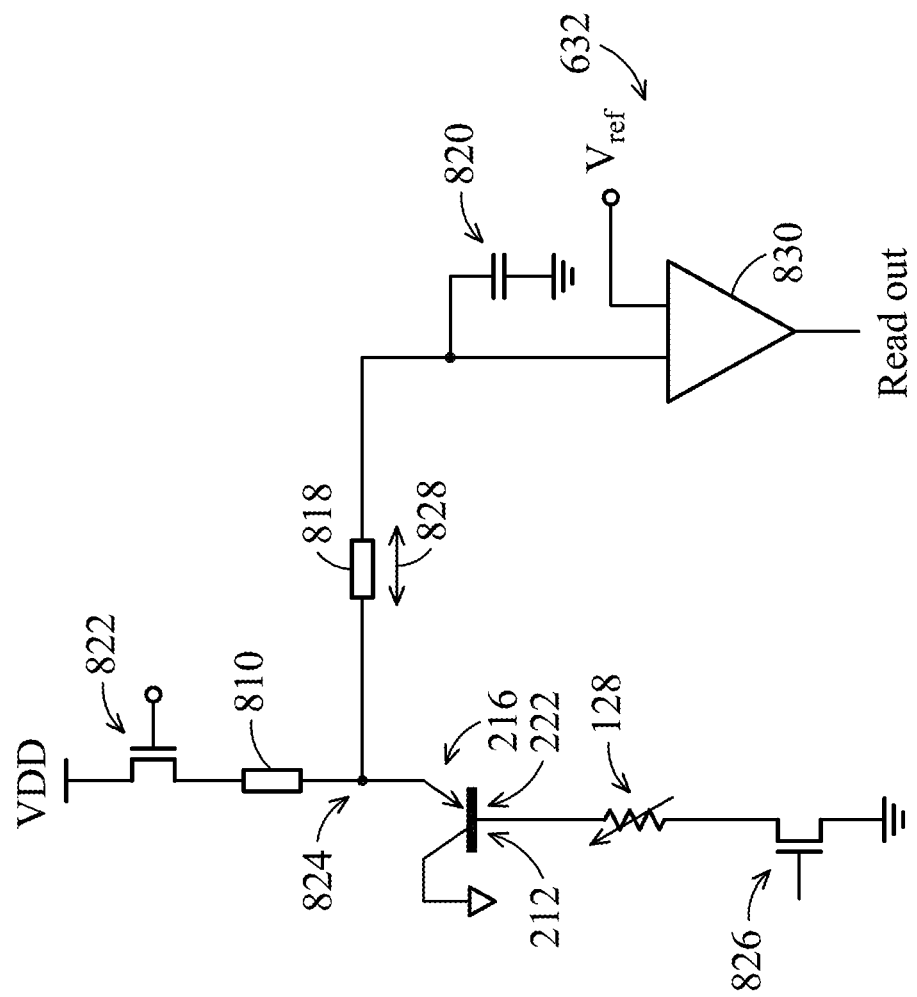

FIGS. 1-7 show embodiments of voltage/current sensing of the sensing path 140 current, which is not limiting. Other sensing approaches are also possible and included in the disclosure. FIG. 8 shows an example MTJ read circuit 800 that includes a charging or discharging elements for sensing the MTJ reading. Referring to FIG. 8, the circuit 800 includes a current steering element 212, e.g., a PNP BJT, having an emitter node 216 coupled to a voltage source VDD through a resistive element 810 and a base node 222 coupled to a MTJ 128. A capacitor 820 is coupled, through a resistive element 818, to a node 824 between the emitter node 216 and the resistive element 810. The capacitor 820 is also coupled to a comparator 830, which is configured to compare a voltage potential stored in the capacitor 820 and a reference voltage 632 and generate an output Readout based on the comparison.

The circuit 800 may be configured to charge or discharge the capacitor 820 based on a current at the emitter node 216, which reflects the read current passing through the MTJ structure 128. As such, a sensing path 828 is set up between the capacitor 820 and the emitter node 216 of the current steering element 212. Specifically, in a charging setup, the switches 822 and 826 are controlled to be switched on, enabling a base node 222 current flowing through the MTJ structure 128. The base node 222 current is affected by the MTJ 128 resistance, i.e., either AP stat resistance or P state resistance. The emitter node 216 current is ($\beta$+1) times the base node 222 current and thus reflects the MTJ 128 resistance. A voltage drop through the resistor 810 is affected by the emitter 216 current, and thus the node 824 voltage is affected by the MTJ 128 resistance. When the MTJ 128 is in the AP state, i.e., higher resistance, the emitter node 216 current is smaller and the node 824 voltage is higher. When the MTJ 128 is in the P state, i.e., lower resistance, the emitter node 216 current is higher and the node 824 voltage is lower. The capacitor 820 is charged by the node 824 voltage. After a properly tuned charging time, the switch 822 is switched off and the charges stored in the capacitor 820 is compared with the reference voltage 832 to determine the resistance level or the magnetization state of the MTJ 128.

In a discharging setup, the capacitor 820 is pre-charged before the MTJ read. The switch 822 is switched on and the switch 826 is switched off such that the capacitor 820 is charged for a properly tuned period of time. In the MTJ read operation, the switch 822 is turned off and the switch 826 is turned on. The capacitor 820 discharges through the current steering element 212 and the MTJ 128. Once again, the emitter node 216 current is ($\beta$+1) times the base node 222 current. The higher emitter node 216 current serves the purposes of reliably discharging the capacitor 820, while the smaller base node 222 current serves to read the MTJ 128 state without switching the MTJ state. When the MTJ structure 128 is in the AP state, i.e., higher resistance, the base node 222 current and the emitter node 216 currents are both lower. Resultantly, the capacitor 820 is discharged slower. After a properly tuned discharging time, a higher residual charge remains within the capacitor 820. When the MTJ structure 128 is in the P state, i.e., lower resistance, the base node 222 current and the emitter node 216 currents are both higher. Resultantly, the capacitor 820 is discharged faster. After the properly tuned discharging time, a lower residual charge remains within the capacitor 820. By comparing the residual charge of the capacitor 820 with the reference 832 (normally a different reference voltage value than that of the charging mode), the MTJ 128 state is read.

Example embodiments of the MTJ read circuits having current steering elements/units are provided to facilitate understanding of the techniques. Variations to the provided examples are possible and included in the principles of the disclosure. For example, the techniques of having a current steering element to provide a smaller read current to read a MTJ structure and a larger sensing current to sense the MTJ reading can be used for all types of MTJ read operations like fast or slow reading, forward or backward reading, current sensing or voltage sensing. The disclosed techniques take away the burden of optimizing a MTJ for both the read and the write operations, which often times contradict one another. With the disclosed techniques, a MTJ optimization can be focused on the write operation, which makes the circuit/system design and configuration much easier.

Figure 9:
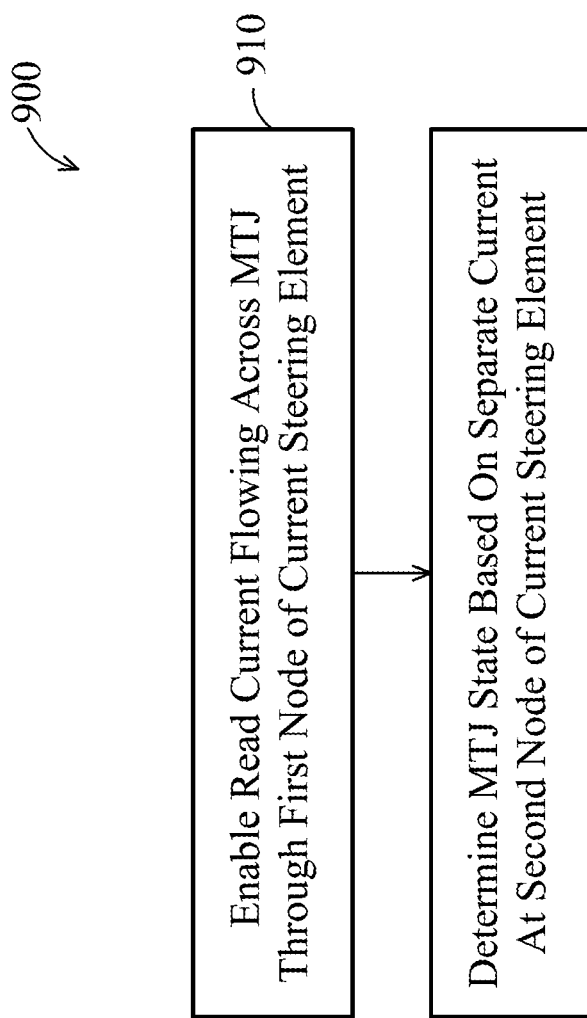
FIG. 9 is another example process.

FIG. 9 is an example method 900, which is used with the MTJ read circuits of FIGS. 1-8 or other MTJ read circuits. Referring to FIG. 9, in example operation 910, a read current is enabled to flow across a magnetic tunnel junction device, e.g., the magnetic tunnel junction structure 128, through a first node, e.g., the node 122, of a current steering element, e.g., the current steering element 112.

In example operation 920, a logic state stored in the magnetic tunnel junction device is determined based on a separate current at a second node 116 of the current steering element 112. The second node 116 has a current gain over the first node 122 that is larger than 1. For example, in the case that the current steering element 112 is implemented through a bipolar junction transistor 212, the current gain between the emitter node 216 and the base node 222 is ($\beta$+1), where $\beta$>0. The current at the second node may be sensed directly through voltage sensing, current sensing or capacitor charging/discharge approaches or other suitable sensing approaches. The current at the second node may also be sensed indirectly via a current mirror unit that mirrors the current at the second node into a mirror current that has a same magnitude as the current at the second node or has a magnitude proportional to the current at the second node.

The present disclosure may be further appreciated with the description of the following embodiments.

In a circuit embodiment, a circuit includes a magnetic tunnel junction structure and a first current steering element. The first current steering element has a first node and a second node. The first current steering element is configured to have a first current at the first node proportionally larger than a second current at the second node. The first node is coupled to a sensing element through a sensing path. The second node is coupled to a read path that includes the magnetic tunnel junction structure.

In a device embodiment, an apparatus includes a memory cell, a current steering device and a sensing amplifier. The memory cell includes a magnetic tunnel junction unit that has a reference layer, a free layer and a tunneling barrier layer sandwiched between the reference layer and the free layer. The memory cell stores a logic state as a magnetization orientation of the free layer. The current steering device is configured to enable a first current flowing through the magnetic tunnel junction and to enable a second current steered away from the magnetic tunnel junction. The second current is proportional to the first current. The sensing amplifier is configured to determine the logic state stored in the memory cell based on the second current.

In a method embodiment, a method includes enabling a first current to flow across a magnetic tunnel junction device through a first node of a current steering unit, and determining a magnetization state of the magnetic tunnel junction device based on a second current at a second node of the current steering unit. The second node having a current gain over the first node that is larger than 1.

What is claimed is:

1. A circuit, comprising:
   a magnetic tunnel junction ("MTJ") structure;
   a first bipolar junction transistor having a first emitter node and a first base node, the first emitter node being coupled to a sensing element through a sensing path and the first base node being coupled to a read path that includes the magnetic tunnel junction structure; and
   a second bipolar junction transistor having a second emitter node and a second base node, the second emitter node being coupled to a sensing reference path, and the second base node being coupled to a read reference path that includes a reference resistive element.

2. The circuit of claim 1, further comprising a voltage clamping element in the read path.

3. The circuit of claim 1, wherein the first bipolar junction transistor and the second bipolar junction transistor are each coupled in a common collector mode.

4. The circuit of claim 1, wherein the first bipolar junction transistor and the second bipolar junction transistor substantially mirror one another.

5. The circuit of claim 1, further comprising a sensing amplifier, and wherein the sensing path is coupled to a first input of the sensing amplifier and the sensing reference path is coupled to a second input of the sensing amplifier.

6. The circuit of claim 1, wherein the sensing path and the sensing reference path substantially mirror one another.

7. The circuit of claim 1, wherein the read path and the read reference path substantially mirror one another except for the reference resistive element and the MTJ structure.

8. The circuit of claim 1, wherein the reference resistive element has a resistance value equal to one of a parallel state resistance of the magnetic tunnel junction structure or an anti-parallel state resistance of the magnetic tunnel junction structure.

9. The circuit of claim 1, wherein the sensing path includes a current mirror element.

10. The circuit of claim 1, wherein the sensing path includes a resistance divider element.

11. The circuit of claim 1, wherein the sensing path includes a charge storage element configured to one of discharge through the sensing path and the first bipolar junction transistor or be charged by a voltage node in the sensing path.

12. The circuit of claim 11, further comprising a precharge circuit configured to charge the charge storage element before the charge storage element discharges through the sensing path.

13. The circuit of claim 1, wherein the sensing element is configured to determine a magnetization state of the magnetic tunnel junction structure based on the first current at the first emitter node.

14. A circuit, comprising:
a magnetic tunnel junction ("MTJ") structure;
a first field effect transistor having a first source or drain node and a first gate node, the first source or drain node being coupled to a sensing element through a sensing path and the first gate node being coupled to a read path that includes the magnetic tunnel junction structure; and
a second field effect transistor having a second source or drain node and a second gate node, the second source or drain node being coupled to a sensing reference path, and the second gate node being coupled to a read reference path that includes a reference resistive element.

15. The circuit of claim 14, further comprising a voltage clamping element in the read path.

16. The circuit of claim 14, wherein the first field effect transistor and the second field effect transistor are each coupled in a common-source mode.

17. The circuit of claim 14, wherein the first field effect transistor and the second field effect transistor substantially mirror one another.

18. The circuit of claim 14, further comprising a sensing amplifier, and wherein the sensing path is coupled to a first input of the sensing amplifier and the sensing reference path is coupled to a second input of the sensing amplifier.

19. An apparatus, comprising:
a memory cell including a magnetic tunnel junction unit having a reference layer, a free layer and a tunneling barrier layer sandwiched between the reference layer and the free layer, the memory cell storing a logic state as a magnetization orientation of the free layer;
a first current steering device configured to enable a first current to flow through a first path including the magnetic tunnel junction and to enable a second current to be steered away from the first path, the second current being proportional to the first current;
a second current steering device configured to enable a third current to flow through a second path including a reference resistive element and to enable a fourth current to be steered away from the second path, the fourth current being proportional to the third current; and
comparator circuitry configured to evaluate the second current with respect to the fourth current.

20. The apparatus of claim 19, wherein the comparator circuitry includes a current mirror structure.

* * * * *